US011650495B2

United States Patent
Budach et al.

(10) Patent No.: US 11,650,495 B2
(45) Date of Patent: *May 16, 2023

(54) APPARATUS AND METHOD FOR DETERMINING A POSITION OF AN ELEMENT ON A PHOTOLITHOGRAPHIC MASK

(71) Applicant: Carl Zeiss SMT GmbH, Oberkochen (DE)

(72) Inventors: Michael Budach, Hanau (DE); Nicole Auth, Ginsheim-Gustavsburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/847,641

(22) Filed: Jun. 23, 2022

(65) Prior Publication Data

US 2022/0334469 A1 Oct. 20, 2022

Related U.S. Application Data

(63) Continuation of application No. 16/737,965, filed on Jan. 9, 2020, now Pat. No. 11,385,540.

(30) Foreign Application Priority Data

Jan. 21, 2019 (DE) .......................... 102019200696.5

(51) Int. Cl.
*G03F 1/86* (2012.01)
*G01B 9/02* (2022.01)
(Continued)

(52) U.S. Cl.
CPC ............... *G03F 1/86* (2013.01); *G01B 9/02* (2013.01); *G01B 11/14* (2013.01); *G03F 9/7061* (2013.01);
(Continued)

(58) Field of Classification Search
CPC .. H01J 37/00; H01J 37/02; H01J 37/26; H01J 37/28; H01J 37/263; H01J 37/20;
(Continued)

(56) References Cited

U.S. PATENT DOCUMENTS 4,785,187 A 11/1988 Kariya et al.
5,081,353 A 1/1992 Yamada et al.
(Continued)

FOREIGN PATENT DOCUMENTS

DE 691 23 612 6/1997
DE 102014212563 1/2016
(Continued)

OTHER PUBLICATIONS

The German Office Action for German Application No. DE 10 2019 200 696.5 dated Oct. 30, 2019.
(Continued)

*Primary Examiner* — Jason L McCormack
(74) *Attorney, Agent, or Firm* — Fish & Richardson P.C.

(57) ABSTRACT

The present application relates to an apparatus for determining a position of at least one element on a photolithographic mask, said apparatus comprising: (a) at least one scanning particle microscope comprising a first reference object, wherein the first reference object is disposed on the scanning particle microscope in such a way that the scanning particle microscope can be used to determine a relative position of the at least one element on the photolithographic mask relative to the first reference object; and (b) at least one distance measuring device, which is embodied to determine a distance between the first reference object and a second reference object, wherein there is a relationship between the second reference object and the photolithographic mask.

20 Claims, 10 Drawing Sheets

(51) Int. Cl.
  *G01B 11/14* (2006.01)
  *G03F 9/00* (2006.01)
  *H01J 37/28* (2006.01)

(52) U.S. Cl.
  CPC ..... *H01J 37/28* (2013.01); *H01J 2237/24578* (2013.01)

(58) Field of Classification Search
  CPC .......... H01J 37/21; H01J 37/22; H01J 37/222; G03F 1/86; G03F 9/7061; G03F 7/70216; G03F 7/70283; G03F 7/70358; G03F 7/70541; G03F 7/7085; G01B 9/02; G01B 11/14; G01J 2237/24578; G01J 2237/0044; G01J 2237/2817; G01J 2237/2826
  USPC .......................................... 250/306, 307, 311
  See application file for complete search history.

(56) References Cited

U.S. PATENT DOCUMENTS

| | | | |
|---|---|---|---|
| 5,504,339 | A | 4/1996 | Masuda |
| 5,699,145 | A | 12/1997 | Makinouchi et al. |
| 5,920,067 | A | 7/1999 | Cresswell et al. |
| 6,437,347 | B1 | 8/2002 | Hartley et al. |
| 6,489,611 | B1 | 12/2002 | Aumond et al. |
| 6,740,456 | B2 | 5/2004 | Kanamitsu |
| 7,018,683 | B2 | 3/2006 | Takaoka et al. |
| 9,336,983 | B2 | 5/2016 | Budach et al. |
| 9,721,754 | B2 | 8/2017 | Bret et al. |
| 2003/0062479 | A1* | 4/2003 | Kametani ............... H01J 37/28 250/310 |
| 2004/0140432 | A1* | 7/2004 | Maldonado ............ B82Y 40/00 250/423 P |
| 2007/0023689 | A1 | 2/2007 | Iizuka et al. |
| 2007/0073580 | A1 | 3/2007 | Perry et al. |
| 2009/0233195 | A1 | 9/2009 | Miyashita |
| 2010/0092876 | A1 | 4/2010 | Kanamitsu |
| 2011/0253892 | A1* | 10/2011 | Yamaguchi ......... H01J 37/3174 250/307 |
| 2013/0056635 | A1 | 3/2013 | Kimba et al. |
| 2013/0299699 | A1 | 11/2013 | Nakayama et al. |
| 2014/0042338 | A1 | 2/2014 | Shibata et al. |
| 2015/0380210 | A1* | 12/2015 | Budach .................. H01J 37/28 250/307 |
| 2018/0204704 | A1 | 7/2018 | Suzuki et al. |
| 2018/0253017 | A1 | 9/2018 | Adel et al. |
| 2020/0233299 | A1 | 1/2020 | Budach et al. |

FOREIGN PATENT DOCUMENTS

| | | |
|---|---|---|
| EP | 1 662 538 | 5/2006 |
| JP | S55-058405 A | 5/1980 |
| JP | 2000-349021 A | 12/2000 |
| JP | 2003-007247 | 1/2003 |
| JP | 2004-241596 A | 8/2004 |
| JP | 2017-152087 A | 8/2017 |
| TW | 201841071 | 11/2018 |
| WO | WO 2008/038751 | 4/2008 |
| WO | WO 2012/090465 | 7/2012 |

OTHER PUBLICATIONS

The Notification of Reasons for Refusal issued by the Japanese Patent Office for Application No. JP 2020-007326, dated Jun. 14, 2021 (with English Translation).

The Office Action and Search Report Issued by the Taiwan Patent Office for Taiwan Application No. TW 109101370 dated Dec. 3, 2020 (With English Translation).

The Partial European Search Report for European Application No. EP 20 15 2894, dated Jun. 8, 2020.

Office Action issued by the Israeli Examination Report for Application No. IL 271881, by Examiner Yoaad Shbita Daud, dated Feb. 14, 2023.

* cited by examiner

APPARATUS AND METHOD FOR DETERMINING A POSITION OF AN ELEMENT ON A PHOTOLITHOGRAPHIC MASK

CROSS-REFERENCE TO RELATED APPLICATIONS

This application is a continuation of and claims priority under 35 U.S.C. § 120 to U.S. patent application Ser. No. 16/737,965, filed on Jan. 9, 2020, which claims priority to German patent application DE 10 2019 200 696.5, filed on Jan. 21, 2019. The entire contents of each of these priority applications are incorporated herein by reference.

TECHNICAL FIELD

The present invention relates to an apparatus and a method for determining a position of an element on a photolithographic mask.

BACKGROUND

Advances in nanotechnology make it possible to produce components with structure elements becoming smaller and smaller. To process and show the nanostructures, tools that can measure these structures are required, so that images of the structure elements can be generated from the measurement data. By way of example, these images can be used to check whether the structure elements are placed at the sites provided by the design and/or whether said structure elements have the predetermined dimensions. Further, the best possible superposition of two or more photomasks when processing wafers can be ascertained on the basis of the image data.

Currently, optical measuring processes are often used to measure components from the field of nanotechnology. However, the resolution of the optical measuring processes is limited by the wavelength of the radiation used to analyze the components. Currently, argon fluoride (ArF) lasers, which emit at a wavelength of approximately 193 nm, form the commercially available light sources with the shortest wavelength.

In some fields, the resolution of microscopes using ArF lasers as light sources is insufficient. By way of example, measuring pattern elements on photolithographic masks requires an accuracy in the single-digit nanometer range, or even in the sub-nanometer range.

Scanning particle microscopes are measurement tools that can supply spatial resolutions in this region. In scanning particle microscopes, a particle beam interacts with a sample. Scanning particle microscopes are abbreviated SBM (Scanning Particle Beam Microscope) below. By way of example, electrons and/or ions are used as particles. However, the use of other particle beams, such as atom beams or molecule beams, is also possible. Large regions of a sample can be scanned or sensed with an adjustable resolution using electron or ion beams. Consequently, scanning particle microscopes are powerful analysis tools for nanotechnology.

However, keeping the position of the particle beam constant in its rest position is difficult in scanning particle microscopes. In this respect, there are two main sources of errors. Firstly, a variation of the beam position of scanning particle microscopes may be brought about due to causes from within the column of the scanning particle microscope. Examples to this end include a change in the setting of the scanning particle microscope, for instance a change in the adjustment, e.g., by changing the focusing and/or the stigmatization. A frequently unavoidable contamination of the column of the SBM leads to electrostatic charging of component parts of the column of the SBM, which deflect the particle beam. Further, thermal drifts of component parts within the column of the scanning particle microscope may be added to the aforementioned causes.

The applicant's U.S. Pat. No. 9,336,983 B2 describes options for ascertaining, and largely compensating, fluctuations of the rest position of the particle beam, the causes of which are predominantly found in the column of the SBM.

Secondly, the beam position of a scanning particle microscope can be influenced by sources whose origins lie outside of the SBM column. An important cause of a reduction in the spatial resolution of a particle beam lies in electrostatic charging of the sample. Moreover, external electric and magnetic fields and occurring disturbance radiation influence a point of incidence of the particle beam of an SPM on a sample. A thermal drift, in respect of the point of incidence of the particle beam, of a sample to be examined is likewise included in the causes of malfunction from outside of the SBM column.

In addition to measuring small structures, a scanning particle microscope is often also used for local processing or repairing of microscopic structures. However, the causes outlined above often lead to distortions in the imaging by the particle beam of a site to be processed and lead to a deterioration in the quality of the repair processes.

In order to minimize these effects, reference structures or reference marks are often attached in the vicinity of the processing site on the sample to be processed and are sensed at regular intervals. The measured deviations of the positions of the reference marks with respect to a reference position are used during a processing procedure of the sample for the purposes of correcting the beam position of the particle beam. This is referred to as "drift correction." The reference marks used to this end are referred to as "DC marks" in the art.

The documents listed below consider the topic of reference marks: U.S. Pat. No. 9,721,754 B2, U.S. Pat. No. 7,018,683, EP 1 662 538 A2, JP 2003-007247 A, US 2007/0023689, US 2007/0073580, U.S. Pat. No. 6,740,456 B2, US 2010/0092876 A1 and U.S. Pat. No. 5,504,339.

The documents specified above describe methods for locally compensating a relative displacement of the point of incidence of a particle beam on a sample. However, it is often necessary to know an absolute position of an element on a sample, for instance a photolithographic mask.

Therefore, the present invention is based on the object of specifying an apparatus and a method for determining a position of an element on a sample.

SUMMARY

According to exemplary embodiments of the present invention, this problem is solved by an apparatus for determining a position of at least one element on a photolithographic mask. The apparatus comprises: (a) at least one scanning particle microscope comprising a first reference object, wherein the first reference object is disposed on the scanning particle microscope in such a way that the scanning particle microscope can be used to determine a relative position of the at least one element on the photolithographic mask relative to the first reference object; and (b) at least one distance measuring device, which is embodied to determine a distance between the first reference object and a second reference object, wherein there is a relationship between the second reference object and the photolithographic mask. For example, the second reference object can be directly or indirectly related to the photolithographic mask in which a distance between the second reference object and the photolithographic mask is known. For example, the second reference object can be part of the photolithographic mask (e.g., a side face of the mask), or can be part of the sample holder, in which the position of the second reference object with respect to the mask is known.

By virtue of determining a relative position of an element of a photolithographic mask with respect to a first reference object and by virtue of a distance being measured between the first and the second reference object, it is possible to ascertain with great precision an absolute position of an element of the photolithographic mask with respect to a reference point of the photolithographic mask or with respect to a mask-internal coordinate system. Here, the first reference object and the second reference object facilitate the substantial elimination of both column-internal and column-external error sources, which lead to a change in the rest position of the particle beam used to sense the at least one element of the photolithographic mask when determining the position of the at least one element of the photolithographic mask.

Measuring the distance or a change in distance between the first and the second reference object allows a precise conversion of the position of the element from a mask coordinate system into a coordinate system that is linked to a sample stage of the apparatus, on which the photolithographic mask is mounted. As a result, a variation in a rest position of the particle beam of the apparatus can be related to an external stable reference, the temporal variation of which is less than that of the photolithographic mask. As a result, the precision when determining the position of the at least one element of the photolithographic mask can be increased.

Finally, the use of an apparatus according to the invention avoids a complicated deposition of reference marks on the photolithographic mask, or more generally on a sample, and, in particular, the often difficult removal of the deposited reference marks from the mask or the sample following the termination of the processing process.

The first reference object can be attached to an output of the scanning particle microscope for at least one particle beam such that the first reference object can be imaged, at least in part, by the at least one particle beam.

A field of view or FOV of the scanning particle microscope is generated by scanning the particle beam over part of the first reference object. The field of view can be presented on a monitor of the SBM. A column-internal disturbance of the SBM, for example a change of settings of the scanning particle microscope leads to a displacement of the scan region of the particle beam and hence to a displacement of the field of view of the scanning particle microscope.

The position of the first reference object that is securely connected to the output of the particle beam of a scanning particle microscope, by contrast, remains substantially uninfluenced in the case of a displacement of the scan region. As a result of securely attaching the first reference object to the output of the scanning particle microscope, the scanning particle microscope equipped with a first reference object consequently comprises a device that can be used to detect the field of view relative to the first reference object and hence determine a change in the point of incidence of the at least one particle beam. Hence, an apparatus according to the invention avoids a repeated time-consuming determination of the distance between the point of incidence of the particle beam on the photolithographic mask before and, e.g., after changing the settings of the scanning particle microscope.

Here and elsewhere in this description, the expression "substantially" denotes an indication of a quantity within the conventional measurement errors, with measuring appliances according to the prior art being used to determine the quantity.

The first reference object may comprise one or two marks.

A change in the point of incidence of the at least one particle beam on a photolithographic mask can be detected at least in part by way of one or two marks situated on the first reference object. Should additional information be known about the type of change, for example that a change in the point of incidence is predominantly implemented in one direction, a reference object comprising one or two marks may be sufficient to determine a relative position of the element on the mask with respect to the first reference object.

The first reference object may comprise at least three marks that span a coordinate system.

By virtue of the at least three marks of the first reference object spanning a coordinate system, it is possible to quantitatively detect not only a change in the point of incidence of the at least one particle beam on the photomask. By virtue of the at least three marks forming one reference frame, it is possible to reliably determine not only the rest position of the particle beam of the scanning particle microscope. Moreover, the at least three marks facilitate the ascertainment of linear and/or nonlinear disturbances in the field of view of a scan region of the particle beam, for example distortions in the field of view. This renders it possible, firstly, to increase the accuracy when determining the position of the at least one element on the photolithographic mask and, secondly, to determine its size and contour with an improved accuracy.

The one, the two and/or the at least three marks can have lateral dimensions ranging from 1 nm to 5000 nm, preferably from 2 nm to 1000 nm, more preferably from 5 nm to 200 nm, and most preferably from 10 nm to 50 nm, and/or the at least three marks can have a height ranging from 1 nm to 1000 nm, preferably from 2 nm to 500 nm, more preferably from 5 nm to 300 nm, and most preferably from 10 nm to 200 nm.

The one, the two and/or the at least three marks may have a material composition that differs from the material composition of the first reference object. Further, the marks may comprise a metal or a metal alloy. Further, the marks may be produced from a precursor gas, which is used to deposit missing material on a photolithographic mask. By way of example, tetraethyl orthosilicate (TEOS) or a metal carbonyl are precursor gases used to this end.

By virtue of the markings of the first reference object having a different material composition to the first reference object, a material contrast arises in addition to the topology contrast when scanning the marks with the particle beam of the scanning particle microscope.

However, it is also possible to use marks that are only based on a topography contrast. This means marks can also be generated by structuring the first reference object.

The first reference object can be disposed within a depth of field of the at least one particle beam of the scanning particle microscope.

As a result, it is possible to image both the at least one element of the photolithographic mask and the mark(s) of the first reference object in focus without having to change the settings of the scanning particle microscope, for instance the focusing thereof. The disturbance source linked to changing of the settings of the SBM, which results in a variation of the rest position of the particle beam, can be avoided as a result thereof.

The first reference object can have a distance from the photolithographic mask ranging from 0.1 nm to 1000 μm, preferably from 1 nm to 500 μm, more preferably from 10 nm to 200 μm and most preferably from 100 nm to 50 μm.

The first reference object can comprise a first number of unit cells, wherein each unit cell can comprise at least three marks, wherein a second number of particle beams can pass through the first number of unit cells, wherein the following applies to the second number: 1≤second number≤first number, and wherein the following applies to the first number: first number >10, preferably first number >50, more preferably first number >200, and most preferably first number >1000.

The first reference object can be designed in such a way that it can be used for a scanning particle microscope that operates with more than one particle beam at the same time. In this case, the first reference object must comprise at least so many unit cells as the scanning particle microscope provides particle beams for simultaneous sensing of a sample.

The first reference object may comprise labels that identify the various unit cells.

The one particle beam or the plurality of particle beams can successively use different unit cells.

The first reference object can be subject to wear or contamination during the course of its use. In particular, this may apply to the marks of the first reference object. It is therefore advantageous if the first reference object comprises substantially more unit cells than there are particle beams provided by the SBM. As a result, the service life of the first reference object can be significantly increased.

The first reference object can comprise a film, on which at least three marks which span a coordinate system are disposed. The film may have no openings. The film may comprise a plurality of unit cells.

A first reference object produced on the basis of a film has three advantages: Firstly, the film has great stability in comparison with a perforated structure, secondly, the film can easily be produced and, thirdly, the particle beam is not influenced by an opening in the first reference object. By virtue of the at least three marks attached to the film forming a coordinate system or forming a reference frame, it is once again possible to ascertain, in addition to a reference or rest position of the particle beam of the scanning particle microscope, a distortion when imaging the scan region of the particle beam and possible to correct said distortion in the presented image of the at least one element of the photolithographic mask.

The film may have a thickness of <200 nm, preferably <50 nm, more preferably <20 nm, and most preferably <10 nm. The film may comprise a polyimide film or a film of polycrystalline semiconductor material, for instance a polycrystalline silicon film.

When choosing the thickness of the film of the first reference element, it should be observed that the particles used to detect the element of the photomask must likewise penetrate through the film in order to reach a detector of the scanning particle microscope of the above-defined apparatus. Further, it is possible to determine the electric current of the secondary electrons absorbed by the film and to take this into account when generating the secondary electron image.

The first reference object may comprise at least one opening, through which the at least one particle beam passes for sensing the photolithographic mask. Each unit cell of the first reference object may have an opening through which a particle beam passes for the purposes of sensing the photolithographic mask.

The opening can have any form. Openings that are easy to produce, for example round openings or openings in the form of polygons, are advantageous.

The first reference object may comprise unit cells, the openings of which having different sizes. As a result, it is possible to adapt the first reference object to different sizes of a scan region of the particle beam of the SBM.

The first reference object may comprise a grid-like structure. The grid-like structure may comprise labels that identify the individual cells of the grid-like structure. The grid-like structure may have cells of different sizes.

A grid-like structure renders it possible to image both a part of the first reference object and a part of a sample surface within the FOV or the field-of-view or the measurement field of the scanning particle microscope and, as a result thereof, easily alternate between the modes of operation of scanning the sample surface on the one hand and scanning the first reference object on the other hand.

The grid-like structure of the first reference object may have openings with a width of ≤30 μm, preferably ≤10 μm, more preferably ≤5 μm and most preferably ≤2 μm. A web of the grid-like structure of the first reference object may have a breadth of ≤5 μm, preferably ≤2 μm, more preferably ≤1 μm and most preferably ≤0.5 μm. The first reference object may have an external dimension of <5.0 mm, preferably <1.0 mm, more preferably <0.3 mm, and most preferably <0.1 mm.

The scanning particle microscope may comprise a scanning unit that is embodied to scan the at least one particle beam of the scanning particle microscope over at least one part of the first reference object and/or over the at least one element of the photolithographic mask.

A scanning unit of the scanning particle microscope can be embodied to scan the at least one particle beam over at least one part of the first reference object and over the element of the photolithographic mask in a common scanning process.

By attaching the first reference object within the depth of field range of the particle beam, the element of the mask and part of the first reference object can be imaged with great precision at the same time, i.e., in one scan, by sensing with the particle beam. As a result, both column-internal and column-external disturbances can be detected in real time and compensated by calculation. Here, the present application exploits the fact that the point of incidence of the particle beam of an SBM on a sample, for example a photomask, changes in the same way as the displacement of the first reference object within a scan region of the particle beam and hence in the field of view of the scanning particle microscope.

The marks of the first reference object are disposed on the first reference object in such a way that these are at least partly sensed by the particle beam during at least partial scanning of the first reference object.

The first reference object can be electrically conductive for compensating surface charges of the photolithographic mask. One side of the first reference object can be attached in electrically insulating fashion to the scanning particle microscope. The first reference object may comprise an amplifier, more particularly a trans-impedance amplifier, which is disposed in spatially separated fashion from the first reference object. The amplifier can be embodied to be connected to the first reference object in electrically conductive fashion.

An additional image channel is detected by virtue of the current generated by the first reference object when scanning the particle beam over the first reference object being additionally measured in addition to the detection of the particles generated by the particle beam in or on the sample. This embodiment is particularly advantageous if the first reference object is embodied in the form of a grid-like structure. Measuring the current generated by the particle beam in the grid-like structure supplies an important signal for distinguishing whether the particle beam is currently guided over part of the first reference object or over part of the sample or photolithographic mask.

The grid-like structure may have labels, with the aid of which data measured during the scanning can be assigned to a portion of the first reference object.

The resolution of a scanning particle microscope can typically vary over a large range. This is accompanied by a variation of the part of the first reference object that is imageable within the FOV. Therefore, it is advantageous if a first reference object, embodied in the form of a grid-like structure, has labels that provide the scale formed by the grid-like structure with a coordinate system such that the individual periods can be unambiguously identified despite the periodicity of the grid-like structure.

A photolithographic mask may contain a transmitting photomask or a reflecting photomask. A photolithographic mask may comprise a binary mask, a phase-shifting mask and two or more masks for multiple exposures. Further, the term photolithographic mask may include a template for nanoimprint lithography. Moreover, the term photolithographic mask may also comprise further component parts of the photolithography process, for instance wafers, ICs (integrated circuits), MEMSs (micro-electromechanical systems) and PICs (photonic integrated circuits).

An element of a photolithographic mask may comprise at least one element of the group of: a structure element or pattern element, a mark and a defect.

The scanning particle microscope can comprise an evaluation unit that is embodied to determine, from a change in the first reference object, a distortion of an image recorded by the at least one particle beam of the particle beam microscope and/or the evaluation unit can be further embodied to determine, on the basis of a model, an electrostatic charge of the sample or the photolithographic mask from a change in the first reference object. For example, the change of the first reference object can be a shift of an electron scanning region within the first reference object caused by a change of one or more parameters or settings of the scanning electron microscope described below.

By virtue of the marks of the first reference object spanning a coordinate system, it is possible to determine and compensate the distortions in the field of view of an image generated with the aid of the particle beam by way of evaluating the relative displacement of the marks with respect to one another. In this correction process, the simultaneity of the scanning of the at least one element of the sample or photolithographic mask and of at least part of the first reference object is again worthwhile.

The scanning particle microscope can comprise a setting unit that is embodied to change at least one setting of the scanning particle microscope. Setting the scanning particle microscope may comprise at least one element from the group: Setting a magnification, setting a focus, setting a stigmator, setting an acceleration voltage, setting a beam displacement, adjusting a position of a particle source of the scanning particle microscope and altering a stop.

The scanning particle microscope can comprise an evaluation unit that is embodied to capture, on the basis of data measured during scanning of the at least one particle beam, a position of a point of incidence of the at least one particle beam on the sample or photolithographic mask relative to the first reference object, both before and after a change in settings.

The evaluation unit can be part of the scanning particle microscope or can be provided as a separate unit. By measuring the position of the first reference object within the field of view of the scanning particle microscope before changing the settings and after carrying out a change in the settings, it is possible to determine a displacement of the beam axis of the scanning particle microscope relative to the first reference object. Here, the assumption is made that the first reference object remains without change with respect to the sample surface when the settings are changed. Instead, a change in settings results in a relative displacement of the field of view of the scanning particle microscope, both in relation to the first reference object and in relation to the sample surface.

The at least one particle beam can comprise at least one element of the group of: an electron beam, an ion beam, an atom beam, a molecule beam and a photon beam The at least one distance measuring unit can comprise at least one interferometer. The interferometer can comprise a laser interferometer and/or a differential interferometer. The interferometer can comprise a Mach-Zehnder interferometer, a Michaelson interferometer and/or a white light interferometer.

The at least one distance measuring unit can comprise a position sensor. The position sensor can comprise at least one element of the group of: a potentiometer transducer, a strain gauge, an inductive sensor, a capacitive sensor and an eddy current sensor.

The first reference object can be embodied to reflect a light beam of the distance measuring device. The first reference object can be embodied to reflect a light beam of at least one interferometer. The at least one reflecting surface can be arranged substantially parallel to the beam axis of the particle beam of the scanning particle microscope. The first reference object can comprise at least two reflecting surfaces, which are disposed substantially parallel to the beam axis of the particle beam and which include an angle of substantially 90° with respect to one another. The first reference object can comprise at least two reflecting surfaces, which are disposed substantially parallel to the beam axis and which include an angle of substantially 180° with respect to one another. The second reference object can comprise at least one element from the group of:

a photolithographic mask, a sample holder for the photolithographic mask, a reflection apparatus which is attached to the photolithographic mask and provided for a light beam of the distance measuring device, and a reflection apparatus which is attached to the sample holder and provided for a light beam of the distance measuring device.

Embodying the second reference object as part of a sample holder is preferred. This embodiment requires no attachment of the second reference object or of a reflection apparatus to individual samples.

The second reference object can comprise a reflection apparatus for at least one light beam of the distance measuring device. The reflection unit of the first reference object and the reflection apparatus of the second reference object can be aligned substantially parallel to one another.

Further, the second reference object can comprise a second reflection apparatus, the reflection surface of which is aligned substantially perpendicular to the at least one particle beam of the scanning particle microscope. The second reflection apparatus of the second reference object can be used to determine a distance between the second reference object and the first reference object in the beam direction (i.e., in the z-direction). As a result, the distance between the output of a column of the scanning particle microscope, at which the first reference object can be attached, and the surface of the photolithographic mask, which faces the particle beam of the scanning particle microscope, can be determined. By way of example, the distance between the first and second reference object in the beam direction can be ascertained by use of an interferometer.

In one embodiment, the method for determining a position of at least one element on a photolithographic mask includes the steps of: (a) at least partial scanning of the at least one element on the photolithographic mask and of a first reference object by at least one particle beam of a scanning particle microscope; (b) determining a relative position of at least one element on the photolithographic mask relative to the first reference object from the scan data; and (c) determining a distance between the first reference object and a second reference object by use of a distance measuring apparatus, wherein there is a relationship between the second reference object and the photolithographic mask.

The at least partial scanning of the at least one element on the photolithographic mask and of at least part of the first reference object can be implemented in a common scanning process.

The method for determining a position of at least one element on a photolithographic mask may further include the step of: determining the position of the at least one element on the photolithographic mask from the distance between the first and second reference object and the relative position determined in step b.

Determining the distance between the first and the second reference object may comprise determining a change in the distance between the first and the second reference objects while scanning the at least one element and the at least one part of the first reference object. By virtue of the interferometer being read during the scanning of the electron beam, it is possible to include detected changes of position in the measurement result.

Determining the position of the at least one element of the photolithographic mask may comprise: determining the position of the at least one element in respect of a mask-internal coordinate system and correcting the determined position using the relative position determined in step b. and the change in the distance between the first and the second reference objects determined in step c.

Determining the relative position in step b. may further comprise: determining a change in position of the at least one particle beam relative to the photolithographic mask during the at least partial scanning of the at least one element on the photolithographic mask.

The first reference object does not only form a reference point or reference position in respect of the column of the scanning particle microscope but also defines a coordinate system in the plane of the first reference object perpendicular to the beam direction of the particle beam. This coordinate system or the reference frame generated thereby facilitate the detection of the occurrence of linear and non-linear disturbances of the scan region during the common scanning of an element of the photolithographic mask and of the at least one part of the first reference object. The detected disturbances can be corrected when generating the image of the scan region. As a result, an apparatus according to the invention facilitates the imaging of an element of the photolithographic mask with an accuracy that has not been achieved previously.

The method for determining a position of at least one element on a photolithographic mask may further include the step of: measuring an electric current generated by the first reference object during the scanning.

The method for determining a position of at least one element on a photolithographic mask may comprise the step of: determining a relative displacement of various parts of the first reference object with respect to a scan region of the particle beam for the purpose of determining a distortion of the scan region when scanning the particle beam over the at least one element of the photolithographic mask and at least one part of the first reference object.

The various parts of the first reference object may comprise different sides of one or more grid cells of a grid-like structure and/or at least three marks of the first reference object, which are not disposed along a straight line.

In a further aspect, a computer program can include instructions which prompt a computer system of the apparatus according to any one of the aspects specified above to carry out the method steps of the above-described aspects.

DESCRIPTION OF DRAWINGS

The following detailed description describes currently preferred exemplary embodiments of the invention, with reference being made to the drawings, in which.

DETAILED DESCRIPTION

Currently preferred embodiments of an apparatus according to the invention and of a method according to the invention are explained in more detail below. The apparatus according to the invention is explained on the basis of a modified scanning electron microscope (SEM). However, the apparatus according to the invention and the method for determining a position of an element on a photolithographic mask are not restricted to the examples discussed below. Rather, these can also be carried out on the basis of any SBM, for example a focused ion beam (FIB) microscope. Further, the use of an apparatus according to the invention is not restricted to the photolithographic masks, which are only described in exemplary fashion below. Naturally, an apparatus according to the invention can likewise be used to determine, for instance, positions on templates for nanoimprint lithography or on wafers during the production process thereof.

Figure 1:
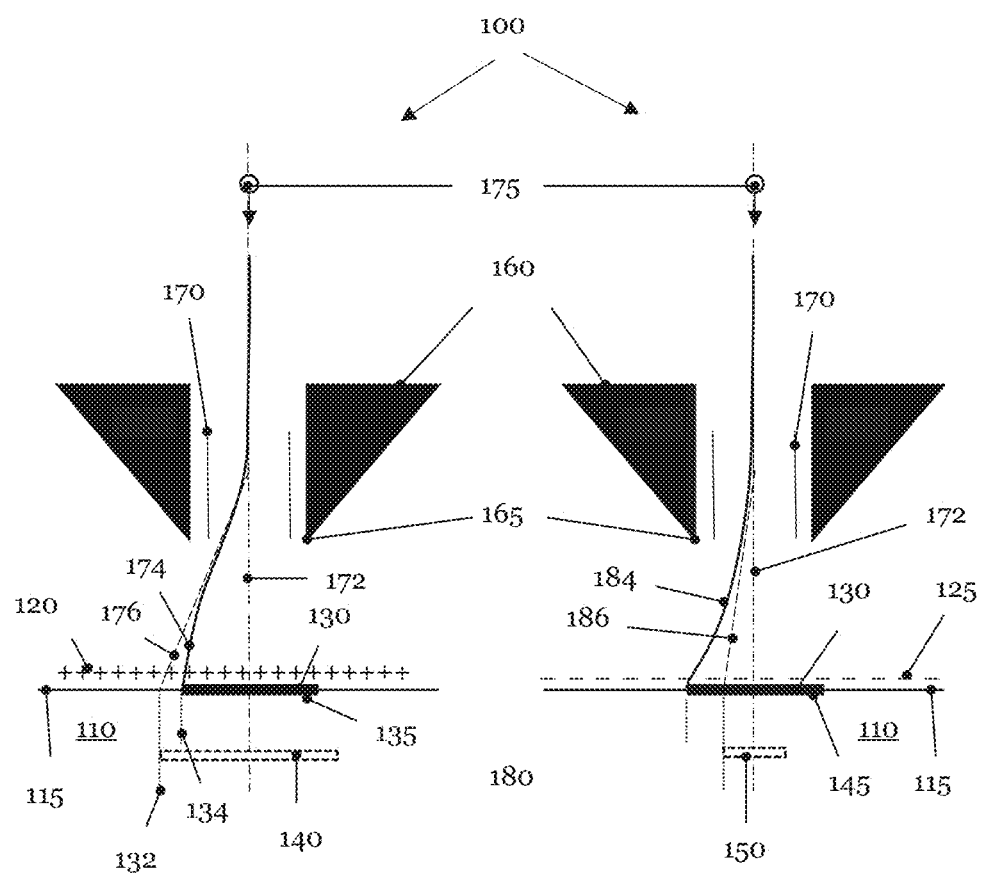
FIG. 1 schematically elucidates the effects of a charged sample when determining the position and size of an element (structure element) of a sample (photolithographic mask)

The diagram 100 of FIG. 1 schematically shows an example of an external disturbance, i.e., a disturbance lying outside of the column of a scanning electron microscope, specifically electrostatic charging of a sample, influencing the determination of a size and/or a position of a structure element of a photolithographic mask. The diagram 100 of FIG. 1 presents schematic sections through a charged sample 110 and an output 165 of a scanning electron microscope 160. As already mentioned, the sample 110 can be an electrically insulating substrate of a photomask or can be a template for nanoimprint lithography. The sample 110 can be a wafer to be processed or said sample can be realised by a photoresist on a wafer. The sample 110 has on its surface 115 a distribution of surface charges that cause an electric potential distribution. On the left part of the image, the sample surface 115 has a positive charge 120. This is symbolized by the crosses 120 in FIG. 1. On the right part of the image, the sample surface 115 exhibits an excess of negative charges 125, which is elucidated by the dashed line 125. The reference signs 120 and 125 are used to denote both a distribution of surface charges on a sample surface 115 and the electric potential distributions caused by the charged surfaces 115.

An electrical charge 120, 125 of a sample surface 115 may be caused by a charged particle beam, for example the electron beam 175 of a scanning electron microscope (SEM) 160. An electric potential distribution 120, 125 of a sample surface 115 may however also be produced by a processing process, for example when processing the sample 110 with an ion beam, and can be caused in the case of a plasma process on a wafer and/or a processing process on a photoresist arranged on a wafer. Furthermore, an electric charge 120, 125 of a sample 110 may be caused for example by the handling of the sample 110.

In the portion of the sample 110 that is represented in the diagram 100 of FIG. 1, the distribution of the surface charges 120, 125 has a uniform density. However, this does not represent a precondition for the use of the apparatus discussed here. Rather, the methods and apparatuses that are presented in this application can also deal with changes in charge density that vary within small lateral distances.

In the example of FIG. 1, a deflection system 170 deflects the electron beam 175 and scans it over the sample surface 115 to determine the dimensions and/or the position of the structure element 130 on the sample 110. By way of example, a structure element 130 may comprise an element of an absorber structure or a pattern element of a photolithographic mask. A structure element 130 can also be an element of a phase-shifting mask. Likewise, a structure element 130 can be an element that a photomask has projected into a photoresist. In another example, the structure element 130 is an element of a chip of a wafer.

As presented in the left part of the image of diagram 100, an electron beam 175 scanning the structure element 130 is deflected by the attractive effect of a positive charge 120 of the sample surface 115 in the vicinity of the sample surface 115 in the direction of the optical axis 172 of the particle beam 175 and follows the trajectory 174. Without the electric potential distribution 120, the electron beam 175 would follow the path 176. The solid structure 135 shows the size of the structure element 130, which the electron beam 175 would determine without electrostatic charging of the sample surface 115. The dashed structure 140 specifies the size of the structure element 130 that the electron beam 175 generates from the structure element 130 in the presence of positive charging of the sample 110. As a result of the positive charging of the sample 110, the electron beam 175 generates an SEM image of the structure element 130 that is greater than the actual dimensions 135 of the structure element 130 in fact are. Should an edge of the structure element 130 be used to determine the placement thereof on a sample 110, the two dotted perpendicular lines 132 and 134 specify the displacement of the placement of the structure element 130 on the sample 110 caused by electrostatic charging.

By analogy, the right part of the image of FIG. 1 illustrates the repulsing effect of a negatively charged 125 sample surface 115 on the path movement 184 of the electrons of an electron beam 175. Due to the additional deflection of the electron beam 175 in the vicinity of the sample surface 115 as a consequence of the charge distribution 125, the actual dimension 145 of the structure element 130 in an SEM image generated from the scanning data appears to be smaller. This is elucidated by the dashed structure 150 in FIG. 1.

If the state of charge, i.e. the local electric potential distribution 120, 125, of the sample surface 115 around a region to be scanned is successfully determined, the incorrect interpretation of the scanning or measurement data of the electron beam 175 of the SEM 160 can be corrected. As a result, the position and/or the size of the structure element 130, for example, can be reproducibly measured, which is of utmost importance for the best possible superposition of two more photomasks. Moreover, in the case of possibly required processing of the structure element 130 with the aid of an electron beam 175 and one or more process gases, suitable settings of the parameters of the SEM 160 can ensure that the structure element 130 is in fact processed in an intended region.

FIG. 1 illustrates, in exemplary fashion, the effect of an external disturbance source when determining the position and/or the size of the structure element 130 of the sample 110. As explained below, the apparatus explained in the following can naturally also be used to correct further external and/or internal disturbing influences on the determination of the placement and/or the size of structure elements 130 of a sample 110.

Figure 2:
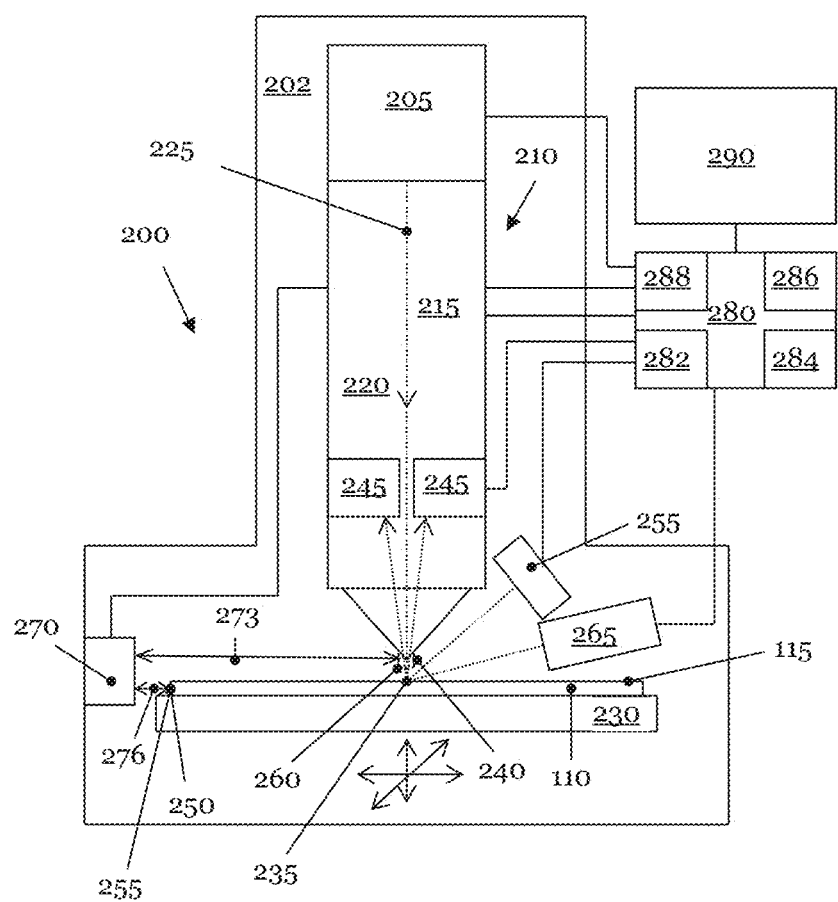
FIG. 2 shows a schematic section through some important components of an apparatus, which can be used to determine a position of an element on a sample.

FIG. 2 schematically shows a section through some component of an apparatus 200 for determining a position of an element, for instance the structure element 130, on a sample 110. A modified scanning particle system 210 is disposed in a vacuum chamber 202. In FIG. 2, the modified scanning particle microscope 210 is embodied in the form of a scanning electron microscope 210. The scanning particle microscope 210 is composed of a particle gun 205 and a column 215, in which the beam optical unit 220, for instance in the form of an electron optical unit 220 of the SBM 210, is disposed. The particle gun 205 produces a particle beam 225 and the electron or beam optical unit 220 focuses the particle beam 225 and directs the latter on a sample 110 at the output of the column 215.

The sample 110 is disposed on a sample stage 230 or sample holder 230. A sample stage 230 is also known as a "stage" in the art. As indicated by the arrows in FIG. 2, the sample stage 230 can be moved in three spatial directions relative to the column 215 of the SBM 210, for example by way of micro-manipulators that are not illustrated in FIG. 2. Further, the sample stage 230 may comprise sensors that are designed to detect the movement of the sample stage 230 relative to the column 215 of the scanning particle microscope 210 in the three spatial directions. Moreover, the sample stage 230 can be embodied to be rotatable about one or more axes (not illustrated in FIG. 2).

Like the translational movements, the rotational movement of the sample stage 230 can be monitored by sensors. The sensors, which are not reproduced in FIG. 2, can be embodied in the form of interferometers, for example.

The particle beam 225 strikes the sample 110 at the measurement point 235. The sample 110 may be any microstructured component part or component. Thus, the sample 110 may comprise, e.g., a transmissive or a reflective photomask and/or a template for nanoimprint technology. The transmissive and the reflective photomask can comprise all types of photomasks, for instance binary masks, phase-shifting masks, MoSi (molybdenum silicide) masks, or masks for a dual or multiple exposure.

As already explained above, the apparatus 200 in the exemplary embodiment elucidated in FIG. 2 comprises a scanning particle microscope 210 in the form of a scanning electron microscope (SEM). An electron beam 225 as a particle beam 225 is advantageous in that it substantially cannot damage the sample 110. However, it is also possible to use an ion beam, an atom beam or a molecule beam (not illustrated in FIG. 2) in the apparatus 200.

At the lower end of the column 215, at which the electron beam 225 leaves the beam optical unit 220 disposed in the column 215, a first reference object 240 is fastened to the column 215. The region around the first reference object 240 is illustrated in magnified fashion in FIG. 3. Details of the first reference object 240 are explained on the basis of the discussion relating to FIGS. 3 to 10.

Further, the apparatus 200 of FIG. 2 may comprise one or more scanning probe microscopes, for example in the form of an atomic force microscope (AFM) (not shown in FIG. 2), which can be used to analyze and/or process the sample 110.

A detector 245, which is disposed in the column 215 of the scanning particle microscope 210, converts the secondary electrons generated by the electron beam 225 at the measurement point 235 and/or electrons backscattered from the sample 110 into an electrical measurement signal and forwards the latter to the evaluation unit 286 of a computer system 280 of the apparatus 200. The detector 245 may contain a filter or a filter system in order to discriminate the electrons in terms of energy and/or solid angle (not reproduced in FIG. 2).

The scanning particle microscope 210 of the apparatus 200 may further comprise a detector 255 for detecting the photons generated by the incident electron beam 225 at the first measurement point 235. The detector 255 may for example spectrally resolve the energy spectrum of the generated photons and thereby allow conclusions to be drawn concerning the composition of the surface 115 or layers near the surface of the sample 110.

Moreover, the scanning particle microscope 210 may comprise an ion source 265 that provides low-energy ions in the region of the first measurement point 235 for the case where the sample 110 is electrically insulating or has an electrically insulating surface layer.

The apparatus 200 further comprises a distance measuring device 270, which is embodied as an interferometer 270, more specifically as a differential interferometer, in the example illustrated in FIG. 2. The interferometer 270 comprises a laser as a light source. The interferometer 270 directs a first light beam 273 on a reflection unit 260 of the first reference element 240. The reflection unit 260 of the first reference element 240 reflects the incident light beam 273 back on the interferometer 270. The interferometer 270 directs a second light beam 276 on a second reference object 250. In the example illustrated in FIG. 2, the second reference object 250 is a side face of the sample 110, for example of a photomask. The second reference object 250 may comprise a reflection apparatus 255 in order to increase the reflectivity of the second reference object 250 in this embodiment. In the example illustrated in FIG. 2, the reflection apparatus 255 of the second reference object can be embodied by the application of a reflecting layer on the side face of the sample 110 intended to reflect the light beam 276. The interferometer 270 measures a relative position, or position and orientation, change between the first 240 and the second reference object 250.

Further, the second reference object 250 may comprise a second reflection apparatus, which is not reproduced in FIG. 2 and which is aligned in the direction of the electron beam 225. The distance between the first reference object 240 and the second reference object 250 can be measured in the beam direction of the electron beam 225 with the aid of, e.g., an interferometer, which is likewise not illustrated in FIG. 2. As a result, it is possible to ascertain the distance of the first reference object 240 from the sample upper side 115 or the upper side 115 of the photolithographic mask 110.

The apparatus 200 contains a computer system 280. The computer system 280 comprises a scanning unit 282, which scans the electron beam 225 over the sample 110 and at least partly over the first reference object 240. Further, the computer system 280 comprises a setting unit 284 for setting and controlling the various parameters of scanning particle microscope 210 of the apparatus 200.

Moreover, the computer system 280 comprises an evaluation unit 286, which analyzes the measurement signals from the detectors 245 and 255 and generates an image therefrom, said image being displayed on the display 290. The region in which the scanning unit 282 scans the electron beam 225 or the particle beam 225 over the sample 110 and/or the reference object 240 is displayed on the monitor 290 of the computer system 280 and is therefore specified the field of view or FOV of the scanning particle microscope 210. In particular, the evaluation unit 286 is designed to determine, from the measurement data of the detector 245, which contain signals from the sample 110 and the first reference object 240, linear and non-linear disturbances in the scan region, which occur when the particle beam 225 is scanned by the scanning unit 282. The evaluation unit 286 moreover contains one or more algorithms that allow the detected disturbances in the representation of the measurement data of the detector 245 on the monitor 290 of the computer system 280 to be corrected. The algorithms of the evaluation unit can be implemented in hardware, software or a combination thereof.

The evaluation unit 286 likewise processes the measurement signals of the distance measuring device 270 or interferometer 270 and represents these graphically or numerically on the monitor 290. To this end, the evaluation unit 286 contains one or more algorithms that are designed to generate image data from the measurement signals of the interferometer 270 and the detectors 245 and/or 255 and, optionally, further measurement data.

Further, the evaluation unit 286 can be designed to also take account of measurement data of the distance measuring device 270, in addition to the measurement data of the detector 245, when representing the element sensed by the scanning unit 282, for example when representing the structure element 130, on the monitor 290.

The computer system 280 and/or the evaluation unit 286 can contain a memory (not illustrated in FIG. 2), preferably a non-volatile memory, which stores one or more models of electric charging for various sample types. On the basis of a model of electrostatic charging, the evaluation unit 286 can be designed to calculate electrostatic charging of a sample 110 from the measurement data of the detector 240. Moreover, the evaluation unit 286 is designed to take account of the electrostatic charging of the sample 110 when representing the scan region on the monitor 290. Moreover, the evaluation unit 286 can prompt the computer system 280 to carry out at least partial compensation by local irradiation by way of the electron beam 225 or low-energy ions of the ion source 265.

As specified in FIG. 2, the evaluation unit 286 can be integrated into the computer system 280. However, it is also possible to embody the evaluation unit 286 as an independent unit within, or outside of, the apparatus 200. In particular, the evaluation unit 286 can be designed to carry out some of its tasks by use of a dedicated hardware implementation.

Finally, the computer system 280 may contain displacement unit 288 which, by feeding electric signals to micromanipulators, prompts the sample stage 230 to be moved in one, two or three spatial directions.

The computer system 280 can be integrated into the apparatus 200 or embodied as an independent appliance (not shown in FIG. 2). The computer system 280 may be configured as hardware, software, firmware or a combination.

Unlike what is illustrated in FIG. 2, the scanning particle microscope 210 of the apparatus 200 may comprise a multi-beam scanning particle microscope, which is able to direct a plurality of particle beams on the sample 110 at the same time (not illustrated in FIG. 2). A multi-beam scanning particle microscope comprises a detector or a detector arrangement, which can detect, in parallel, secondary particles generated by the individual particle beams. Moreover, the evaluation unit 286 of a multi-beam scanning particle microscope is designed to combine the partial images generated from the secondary particles of the individual particle beams to form an overall image.

Figure 3:
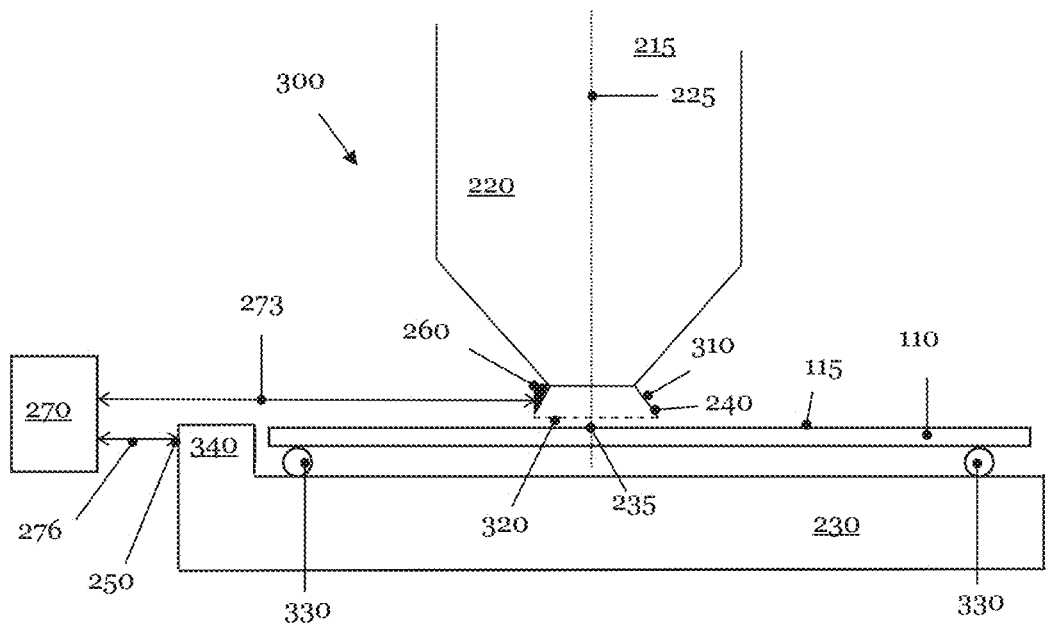
FIG. 3 reproduces a magnified section of the apparatus of FIG. 2 from the region of the sample.

The diagram 300 of FIG. 3 shows a magnified section of the apparatus 200 in the region of the point of incidence 235 of the particle beam 225 on the sample 110. The first reference object 240 is securely connected to the lower end of the column 215 by the holder 310. Within the scan region of the electron beam 225, the reference object 240 in the example of FIG. 3 comprises a mesh-like or grid-like structure 320 with openings, through which the electron beam 225 can pass the grid-like structure 320 substantially without interacting with the latter.

On the left-hand side, the first reference object 240 comprises a reflection unit 260, which is attached to the holder 310 of the first reference object 240 in the example of FIG. 3. In the diagram 300, the reflection unit 260 is attached to the holder 310 of the first reference object 240 in such a way that the majority of an incident light beam 273 is reflected by the reflection unit 260 (R>80%). In order to optimize the reflection coefficient of the reflection unit 260, the side of the reflection unit 260 of the first reference object 240 facing the light beam 273 of the distance measuring device 270 can be provided with a reflecting layer. Here, the reflecting layer can be designed in such a way that the reflection coefficient thereof is at a maximum at the wavelength of the light beam 273 (not reproduced in FIG. 3). In the example reproduced in FIG. 3, the first reference object 240 consequently comprises the holder 310, the grid-like structure 320 and the reflection unit 260.

In the example illustrated in FIG. 3, the sample 110, for example a photolithographic mask 110, is disposed on the sample stage 230 by use of a three-point bearing. The sample 110 is held in its position by the action of gravity. The section of the diagram 300 shows two of the three spheres 330 of the three-point bearing. The second reference object 250 is formed by a frame structure 340 of the sample stage 230 in the example illustrated in FIG. 3. In its simplest form, the frame 340 of the sample stage 230 has a metallic reflectivity. Should this be the case, the distance measuring device 270 can shine the light beam 276 directly onto the frame part 340 of the sample stage 230 and the frame part 340 reflects the majority of the light beam 276 back to the distance measuring device 270 or the interferometer 270.

Like in the case of the reflection unit 260 of the first reference object 240, it is also possible to provide the part of the frame structure 340 of the sample stage 230, which forms the second reference object 250, with a reflecting layer for the purposes of increasing the reflectivity thereof (not shown in FIG. 3). This increases the reflected component of the second light beam 276 of the interferometer 270, which second light beam is incident on the reflecting layer of the second reference object 250.

The particle beam 225 of the scanning particle microscope 210 of the apparatus 200 can be used to measure markers present on the sample 110 and/or a photomask 110. Should the sample 110 or the photolithographic mask 110 have an internal coordinate system in the form of different markers, it is possible to ascertain the absolute position of, for instance, a structure element 130 on the sample 110. The first reference object 240 can be used to determine a change in position and orientation of the particle beam 225 relative to the first reference object 240. Further, the distance measuring device 270 measures a change in position of the first reference object 240, i.e., the column 215 of the scanning particle microscope 210, relative to the second reference object 250, i.e., the sample surface 115. Ultimately, this detects a change in the rest position of the particle beam 225 with respect to the sample 110. As a result, it is possible to ascertain two correction values, which can be used to improve the determination of the position of the structure element. In particular, the distance measuring device 270 allows an absolute position of the structure element 130 to be determined in relation to a stable external reference. By way of example, an external stable reference can be a coordinate system connected to the sample stage 230. The accuracy connected with determining the position of the structure element 130 can be significantly increased by way of a reference to an external reference point that is stable over time.

The embodiment illustrated in the diagram 300 allows determination of a change in position, along one direction, of the two reference objects 240 and 250 with respect to one another. By virtue of disposing a second distance measuring device 270 in the apparatus 200, said second distance measuring device not being aligned parallel to the first distance measuring device 270, it is possible to determine the change in position of the two reference objects 240 and 250 with respect to one another in the plane of the sample 110. Preferably, the two distance measuring devices 270 are installed in the apparatus 200 in a manner rotated through an angle of 90° with respect to one another about the beam axis of the particle beam 225.

Further, it is possible to use two distance measuring apparatuses 270 for each direction, said distance measuring apparatuses preferably being disposed on a straight line on both sides of the first reference object 240 or the second reference object 250. This firstly renders it possible to easily determine a change in length or distortion of the first reference object 240. Secondly, this also facilitates the analysis of large samples, the surfaces of which are very uneven. At least one of the two distance measuring devices 270 for a direction should not be shadowed by the sample 110.

In the apparatuses 200 presented in FIGS. 2 and 3, the distance measuring devices 270 are embodied as interferometers. It is also possible to implement the distance measuring device 270 in the form of a position sensor (not illustrated in FIGS. 2 and 3). By way of example, the position sensor can be implemented as a potentiometer transducer or a strain gauge. However, a position sensor can also be embodied as a resistive, capacitive and/or as a magneto-inductive distance sensor.

Figure 4:
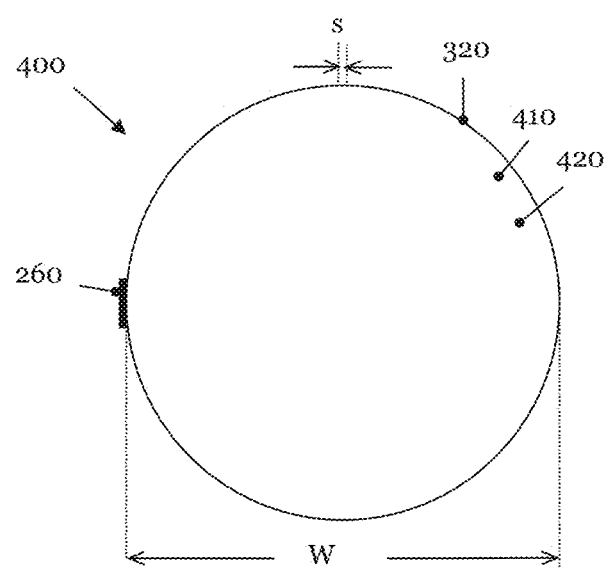
FIG. 4 represents a schematic plan view of a first exemplary embodiment of a first reference object, embodied in the form of a grid.

The diagram 400 of FIG. 4 presents, in schematic and greatly magnified fashion, an example of a grid-like structure 320 of a first exemplary embodiment of the first reference object 240 in a plan view. In the example illustrated in FIG. 4, the grid-like structure 320 comprises a grid 410 with square openings 420. The width of the individual openings 420 of the grid 410 is denoted by "s". By way of example, the electron beam 225 or the particle beam 225 can pass through one of the openings 420 in the center of the grid 410 in order to reach a sample 110 disposed below the grid 410 (the sample is not illustrated in FIG. 4).

The reflection unit 260 is visible on the left-hand side of the first reference object 240 of FIG. 4.

The exemplary grid 410 of FIG. 4 has an external dimension "W". The external dimension of the grid 410 of the first reference object 240 depends on the imaging properties of the SBM 210, to which said grid is fastened. Moreover, the external dimension of the grid 410 or the grid-like structure 320, just like the external dimension of the first reference object 240 overall, depends on the surface topology of the sample 110. In order to be able to simultaneously image part of the sample 110 and part of the grid 410 in focus, the grid 410 should be attached at the smallest possible distance from the sample surface 115. On account of this demand, it is advantageous to adapt the size of the first reference object 240, and hence the external dimension "W" of the grid 410, to the unevenness of the sample 110. However, it is often not necessary to dispose the first reference object 240 with as little distance as possible from the sample surface 115 since the beam optical unit 220 of the scanning particle microscope 210 is adjusted in such a way that an adjustment of the focus substantially does not influence the lateral position of the particle beam 225. In the case of samples 110 whose surfaces 115 are substantially flat, it is possible to choose the external dimension "W" of the grid 410 in such a way that, firstly, its production is without problems and, secondly, its external dimension can be adapted to the largest possible scan region of the particle beam 225 of the SEM 210.

The external dimension "W" of the grid 410, and hence of the first reference object 240, can range from approximately 0.1 mm to approximately 10 mm. The distance of the grid 410, and hence of the first reference object 240, from the sample surface 115 can vary within a range from approximately 100 nm to approximately 50 µm. The grid 410, and hence the first reference object 240, is round in the example of FIG. 4. This is advantageous since the beam apertures of SBMs 210 preferably have this form. However, the first reference object 240 is not restricted to a circular embodiment; instead, the first reference object 240 can have an external contour with any shape, for instance a triangle, a quadrilateral or, generally, an n-gon.

Figure 5:
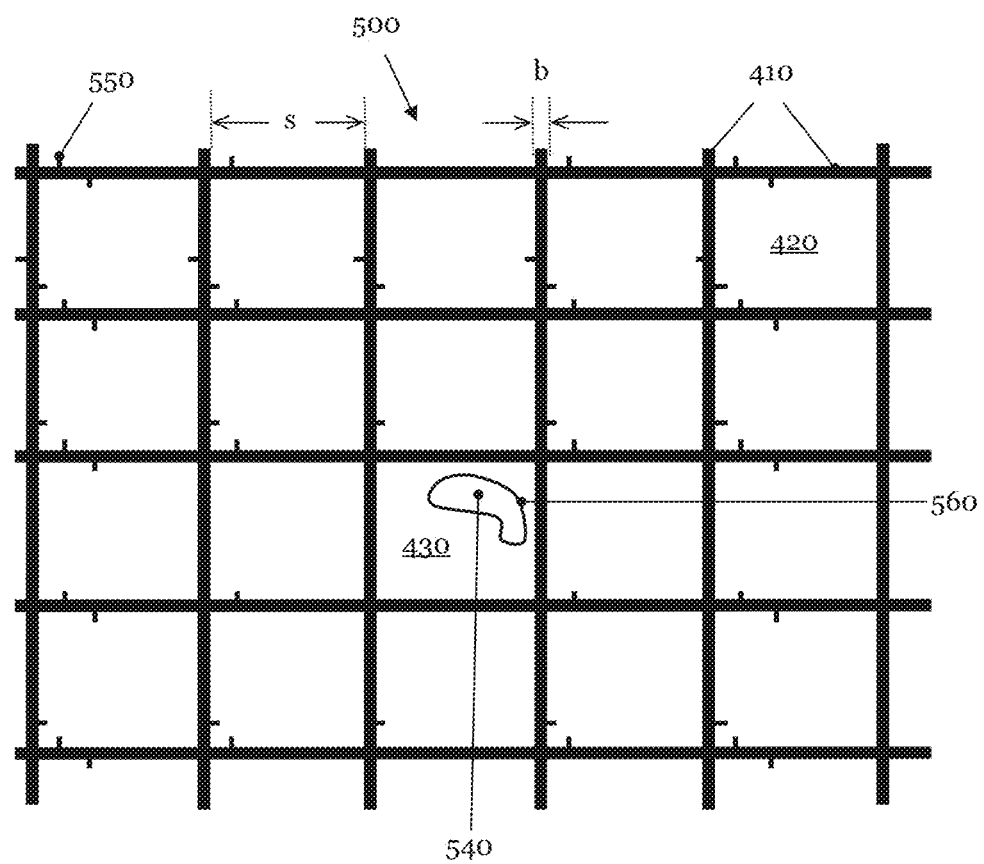
FIG. 5 illustrates a magnified section of the grid of the first reference object of FIG. 4 with an element in the form of a defect of the sample surface.

FIG. 5 reproduces a magnified section 500 of the grid 410 of FIG. 4. In the section of the exemplary grid 410 illustrated in FIG. 5, the square openings 420 have a width "s", which ranges from approximately 0.5 µm to approximately 100 µm. Hence, the sample 110 can be sensed by use of the electron beam 225 within the grid opening 420 without the electron beam 225 being substantially influenced by the grid 410. A typical scan region of the electron beam 225 comprises an area from approximately 1 µm×1 µm to approximately 1 mm×1 mm. The webs of the grid 410 have a material strength "b" from approximately 0.5 µm to approximately 50 µm.

In the example specified in FIG. 5, a sample 110, which is attached below the grid 410, comprises an element 540 with a contour 560 in the region of the central opening 430 of the grid 410 of the first reference object 240. The element 540 may be a defect of the sample 110. However, the element 540 could also be a structure element 130 of the sample 110. In the example where the sample 110 is a photomask 110, the element 540 can be an element of an absorber structure or a mark applied to the sample 110. So that scanning of the element 540 by use of the particle beam 225 is substantially uninfluenced by the first reference object 240, the particle beam 225 must have a distance of a few beam diameters from the webs of the first reference object 240. Since a focused electron beam 225 typically has a beam diameter in the single-digit nanometer range, a distance of approximately 10 nm between the electron beam 225 and the webs of the first reference object 240 is sufficient to ensure that scanning of the element 540 is substantially uninfluenced by the first reference object 240. Moreover, the electron beam 225 or particle beam 225 has an aperture angle that typically ranges from 0.1 mrad to 10 mrad. This means that the electron beam is larger in the region of the first reference object 240 than at the focus. These circumstances need to be taken into account when estimating the distance of the electron beam 225 from the webs of the grid 410. Here, "mrad" denotes milliradians.

In order to form the grid 410 of the first reference object 240 into a coordinate system, the grid 410 comprises marks 550 in the example of FIG. 5. In the example illustrated in FIG. 5, the reference point of the coordinate system is the central opening 430, through which the electron beam 225 preferably passes for the purposes of scanning the sample 110. However, it is also possible to use any grid opening 420 for scanning an element 540. In the example of FIG. 5, the central grid opening 430 does not have a mark 550. All grid openings 420 bar the central grid opening 430 have one or more marks 550 in the x- and the y-direction, which uniquely label the respective grid opening 420 with respect to the central grid opening 430. In the example illustrated in FIG. 5, this is a line marking for each column and row that the grid opening 420 is distanced from the central grid opening 430.

The individual grid openings 420 of the grid-like structure 310 of the first reference object 240 form a reference frame. It is possible to determine a linear or non-linear disturbance when scanning the element 540 on the basis of the ascertained deformation of the grid cells 420 of the first reference object 240, or else the reference frame, ascertained during the scanning of a region comprising both the element 540 and at least a part of the webs of a grid opening 430. Said disturbance can be corrected by the evaluation unit 286 of the computer system 280 of the apparatus 200, before presenting the element 540 on the monitor 290.

Should the scanning particle microscope 210 of the apparatus 200 be embodied as a multi-beam SBM, the grid 410 of the first reference object 240 can be divided into segments with a central grid opening 430 for each individual particle beam 225 of the multi-beam SBM, said central grid openings being surrounded by numbered grid openings 420 (not shown in FIG. 5).

In order to be able to determine the position of the electrode beam 225 relative to the first reference object 240 with the aid of image processing algorithms, the edges of the first reference object 240 should be sharply defined so that these can be identified well with the aid of the particle beam 225. In addition or as an alternative thereto, the contrast supplied by the first reference object 240 in the SBM image (e.g., by way of a material contrast) should significantly differentiate the first reference object 240 from the background, i.e., the signal generated by the sample 110. Moreover, it is advantageous to choose the geometry of the first reference object 240 in such a way that the image processing can be kept as simple as possible, for example by virtue of the SBM images being similar at different magnifications.

In an exemplary embodiment, the particle beam 225 scans the element 540 of the sample 110 within the central opening 430 of the grid 410 of the first reference object 240 in order to analyze the placement and/or size of said element. By way of example, the settings of one or more parameters of the SBM 210 are altered in order to examine the element 540 at a different resolution or with a different kinetic energy of the particles of the particle beam 225. These change(s) in the settings of the scanning particle microscope 210 can move, distort and/or twist the path of the particles or electrons through the beam optical unit 220 disposed in the column 215 of the SBM 210. This changes the point of incidence of a particle beam or of the electron beam 225 on the sample 110. By virtue of the change in the scan region of the particle beam 225 with respect to the first reference object 240 being detected, it is possible for the evaluation unit 286 of the apparatus 200 to correct these column-internal disturbances. By correcting the disturbance of the scan region of the particle beam 225, the apparatus 200 improves the determination of the position of the element 540.

Figure 6:
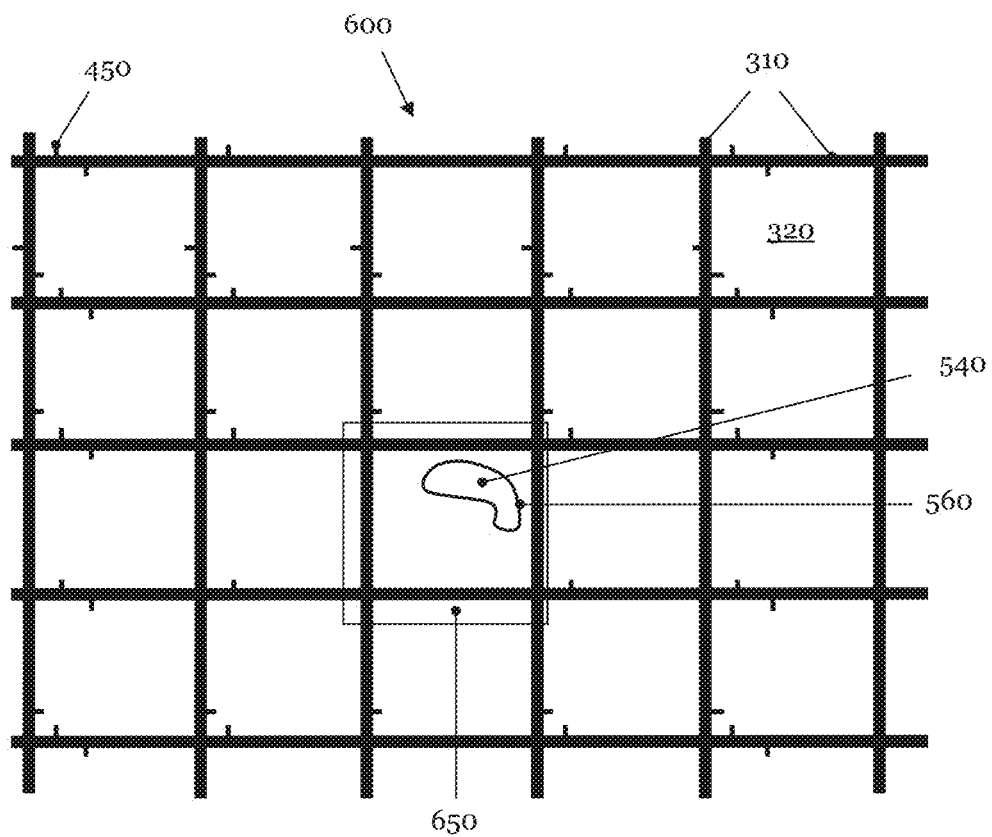
FIG. 6 reproduces FIG. 5 with a scan region that includes the site of a grid opening around the element on the sample and that is implemented before changing the settings of the scanning particle microscope.

Thus, before a setting of the SBM 200, which leads to a variation of the point of incidence 235 of the particle beam 210 on the surface 115 of the sample 110, is modified, the scan region of the particle beam 225 is increased to such an extent that the particle beam 225 images at least one grid opening, preferably the central grid open 430, and the webs or rods of the grid 410 of the first reference object 240 surrounding said opening. FIG. 6 schematically shows the scan region 650 of the particle beam 225, and hence also the image region 650 of the SBM 210. So that both the element 540 of the sample 110 and the webs of the grid 410 are illustrated simultaneously in focus in an SBM image generated by the evaluation unit 286 of the computer system 280, it is advantageous if the distance between the sample surface 115 and the grid 410 is as small as possible such that both objects, the element 540 and the grid 410, lie within the depth of field range of the SBM 210.

In an alternative embodiment, the focus of the electron beam 225 in a first scan lies on the surface 115 of the sample 110 or of the element 540. Then, the focus of the particle beam 225 is focused on the plane of the grid 410 and the same scan region 650 is sampled again. This embodiment is advantageous, in particular, if the sample surface 115 and the grid 410 of the first reference object 240 have a large spacing (e.g., >100 µm). The data from scanning the scan region 650, which represent the grid 410 of the first reference object 240, are analyzed and/or stored by the evaluation unit 286 of the computer system 185.

One or more changes are made in the settings of the SBM 210 in the next step. Examples of changes in the settings of the SBM 210 include: changing the magnification, changing the focus, changing the stigmator, changing the acceleration voltage, changing the beam displacement, changing a stop and/or adjusting the position of the particle source 205 of the scanning particle microscope 210. As already explained above, these change(s) in the settings of the SBM 210 can move or distort the path of the particles through the beam optical unit 220 disposed in the column 315 of the SBM 210. Repeated scanning of the scan region 650 leads to a displacement of the scan region 650 relative to the first reference object 240 and the element 540 of the sample surface 115.

Figure 7:
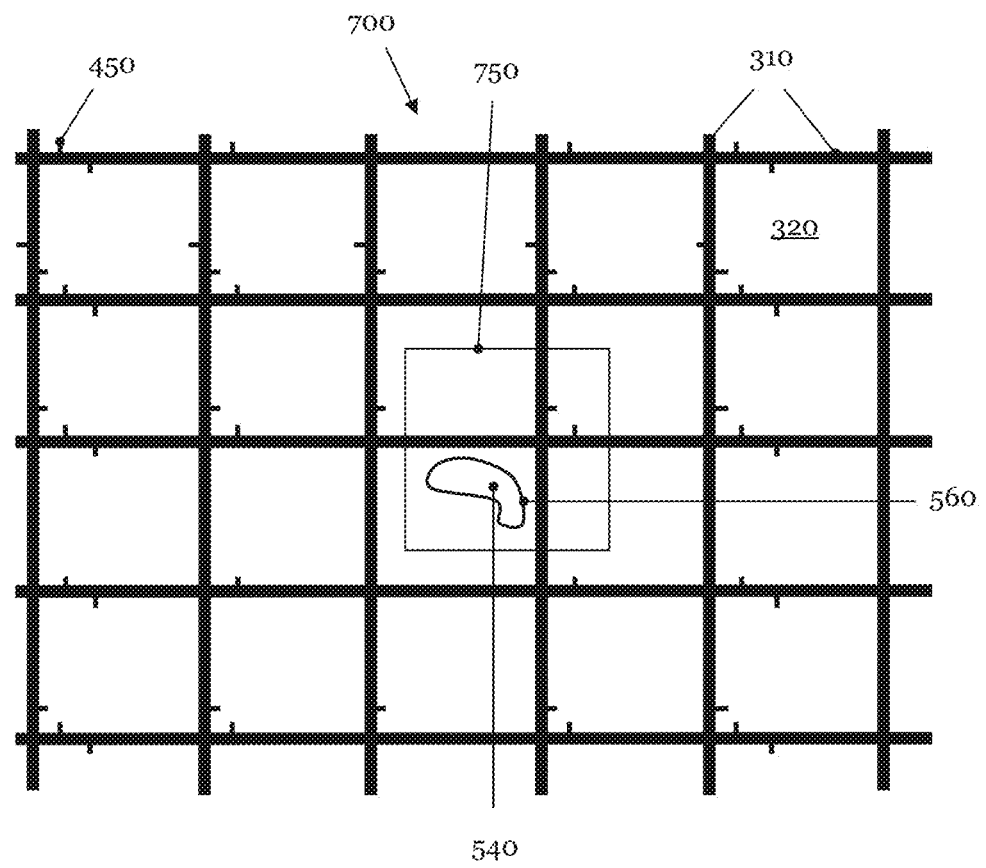
FIG. 7 shows the displacement of the scan region of FIG. 6 after carrying out the change in settings of the scanning particle microscope.

FIG. 7 elucidates the displacement of the scan region 750 in comparison with the scan region 650 before carrying out a change in the settings, or before changing the settings, of the scanning particle microscope 210. The evaluation unit 286 of the computer system 280 determines the displacement of the point of incidence 235 of the particle beam 225 on the surface 115 of the sample 110 from the data of the scan before (scan region 650) and after changing the settings of the SBM 210 (scan region 750). In addition to a displacement of the scan region 750, the latter could also experience a deformation or a distortion as a result of a change in the settings of the scanning particle microscope 210; these disturbances can be detected on the basis of a change in the form of the grid openings that form a reference frame (not illustrated in FIG. 7).

FIGS. 6 and 7 illustrate an example in which the evaluation unit 286 can be configured to determine, from a change in the first reference object 240, the distortion of the particle beam image recorded by the particle beam 225. The evaluation unit 286 can also be configured to determine, on the basis of a model of electrostatic charging, an electrostatic charge of the sample or the photolithographic mask 110 from the change in the first reference object 240. For example, the change of the first reference object 240 can be a shift of the electron scan region within the first reference object 240 caused by the change of one or more parameters or settings of the scanning electron microscope described above.

Figure 8:
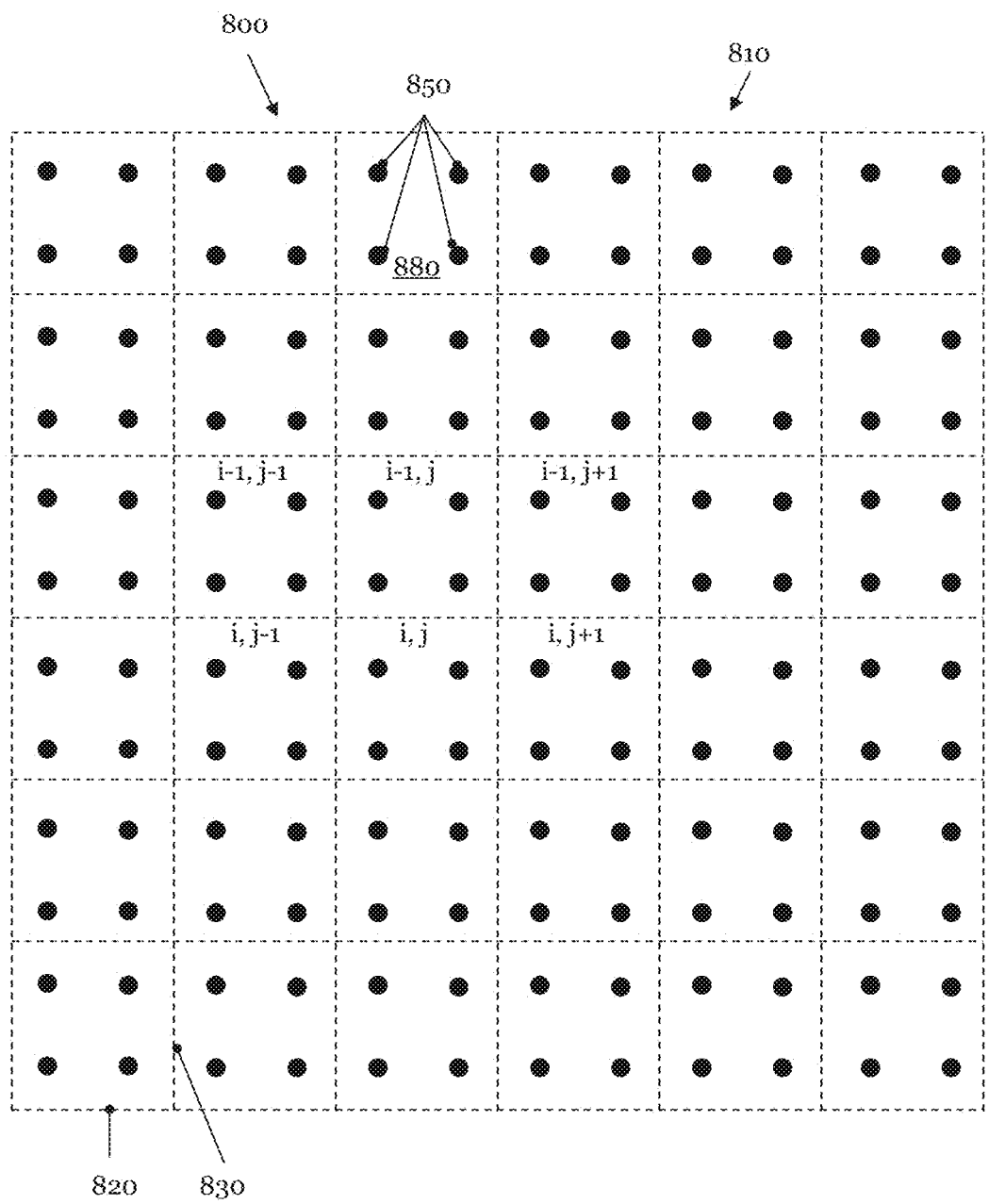
FIG. 8 presents a second exemplary embodiment of the first reference object, embodied as a film with marks.

FIG. 8 schematically shows a plan view of a section 800 of a second exemplary embodiment of the first reference object 240. In the example illustrated in FIG. 8, the first reference object 240 comprises a film 810. The film 810 can comprise a thin metal film with a thickness ranging from 10 nm to 200 nm. Instead of a metal film, the first reference object 240 may comprise a polyimide film. By way of dashed horizontal 820 and vertical lines 830, the film 810 is divided into unit cells 880, which correspond to the grid openings 420 of the grid-like structure 320 of FIGS. 4 and 7. When choosing the thickness of the film 810, it must be considered that the secondary particles generated by the sample 110 located below the film must pass through the film 810 in order to reach the detector 245 of the apparatus 200. Moreover, it is possible—as already explained above for the first reference object 240 in the form of a grid 310—to measure the current generated by the secondary electrons of the sample 110 and take said current into consideration when generating the secondary electron image.

Unlike the grid 410, the film 810 cannot supply a contrast signal of the particle beam 225 of the scanning particle microscope 210 when said particle beam 225 passes therethrough. Therefore, each unit cell 880 of the film 810 comprises four reference marks 850 or simply marks 850. In the example of FIG. 8, these are attached to the corners of a square. As a result, the marks 850 span a coordinate system in each unit cell 880. The marks 850 of the film 810 have a round form in the example of FIG. 8. The diameter of the marks 850 is preferably in the range of 50 nm to 200 nm. The height of the marks comprises a preferred range of 10 nm to 100 nm. It is advantageous to construct the reference marks 850 from a material that differs from that of the film such that the particle beam 225, which senses the film 810 or the sample 110 and the marks 850, additionally also supplies a material contrast in addition to a topology contrast. Reference is made to the explanations with respect to FIG. 5 for the choice of the size of a unit cell 880 of the film 810.

In order to be able to distinguish between the various unit cells 880 of the film 810, these can be labelled, for instance by a combination of two numbers. In FIG. 8, this is specified for a few central unit cells 880 of the film 810.

The marks 850 on the film may degrade during the running operation of the first reference object 240. Firstly, this may be caused by dirtying of the marks 850, as a result of which the spatial resolution thereof is reduced. Secondly, the structure of the marks 850 may be modified as a result of the frequent sensing by the particle beam 225, said marks hence becoming unusable over time. Since the first reference object 240 embodied in the form of a film 810 has numerous unit cells 840, the latter can be used successively for determining the position of an element 130, 540 on a sample 110. The lifetime of a first reference object 240 embodied as a film 810 can be lengthened many times over as a result thereof.

Similar to the embodiment of the first reference object 240 in the form of a grid 410, the embodiment of the first reference object 240 in the form of a film 810, discussed in FIG. 8, is likewise suitable for a multi-beam SBM. Since the marks 850 on the film moreover span a coordinate system, said marks form a reference frame that can be used to detect disturbances that occur within a scan region during a scanning procedure and correct said disturbances with the aid of the evaluation unit 286.

All unit cells 880 have an identical size in the example illustrated in FIG. 8. However, it is also possible to dispose unit cells 880 with different sizes on the film 810. As a result, the size of a unit cell 880 can be adapted to the scan region of the particle beam 225 of the scanning particle microscope 210 of the apparatus 200 (not illustrated in FIG. 8).

The use of a first reference object 240 on the basis of a film 810 is advantageous since imaging of the element 540 through the film 810 only influences the particle beam minimally. This has an advantageous effect on the accuracy with which the position of the element 540 of the sample 110 is determined. Moreover, the film 810 is easily producible. In respect of sensing the markings 850 of the second exemplary embodiment of the first reference object 240, reference is made to the explanations in the context of FIG. 6.

Figure 9:
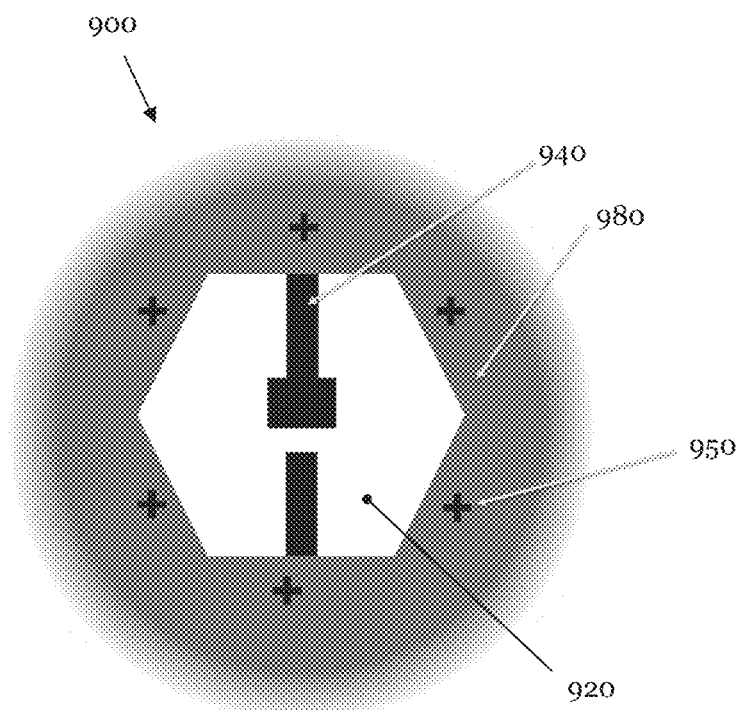
FIG. 9 shows a unit cell of a third exemplary embodiment of the first reference object.

The diagram 900 of FIG. 9 shows a schematic plan view of a section of a third exemplary embodiment of a first reference object 240. The section illustrated in FIG. 9 presents a unit cell 980 of the third embodiment of the first reference object 240. The unit cell 980 has an opening 920. The opening 920 opens up a view of a structure element 940 of the sample 110 or of the photolithographic mask 110. As explained in the context of FIG. 5, it may be difficult to image the webs of a grid opening 420 of the grid in focus. This also applies to the edges of the opening 920 of a unit cell 940 of the third exemplary embodiment of the first reference object. As a result, it may be difficult to reliably detect a change in the position of the structure element 940 in relation to the first reference object 240.

The second exemplary embodiment of the first reference object 240 circumvents these difficulties by virtue of applying marks 850 on a film 810. However, a disadvantage of the second exemplary embodiment is that both the particle beam 225 and the secondary particles originating from the sample 110 must pass the film 810. The third exemplary embodiment of the first reference object 240 avoids both disadvantages. By virtue of each unit cell 920 having an opening, neither the particle beam 225 nor the secondary particles have to be transmitted through the film 810. Additionally, the third exemplary embodiment of the first reference object 240 in question avoids the use of the edges of the openings of the unit cell 920 to determine the position of the structure element 940 relative to the first reference object 240 and hence relative to the output of the column 215 of the scanning particle microscope 210. To this end, the reference object 240 in the third exemplary embodiment comprises six marks 950 that are disposed around the opening of the unit cell 920.

The markings 950 of each unit cell 980 have a cruciform structure in the third exemplary embodiment. However, the marks 950 may be embodied in any other form, for example as a rectangle or as a square. As already explained in the context of FIG. 8, it is advantageous if the marks 950 have a different material composition to the material of the first reference element 240. As a result, the marks 950 additionally generate a material contrast in addition to a topology contrast during sensing with the particle beam 225. In the example of FIG. 9, the unit cell 980 has a hexagonal form. However, the opening 920 of the unit cell may be embodied in any other form, for example in the form of a circular, rectangular or square opening (not illustrated in FIG. 9). Further, it is advantageous, albeit not necessary, to adapt the number of marks 950 per unit cell 920 to the form of the opening 920 of the unit cell 980. At least three marks 980 per unit cell 980 of the third exemplary embodiment of the first reference object 240 are required to form a coordinate system or span a reference frame.

Figure 10:
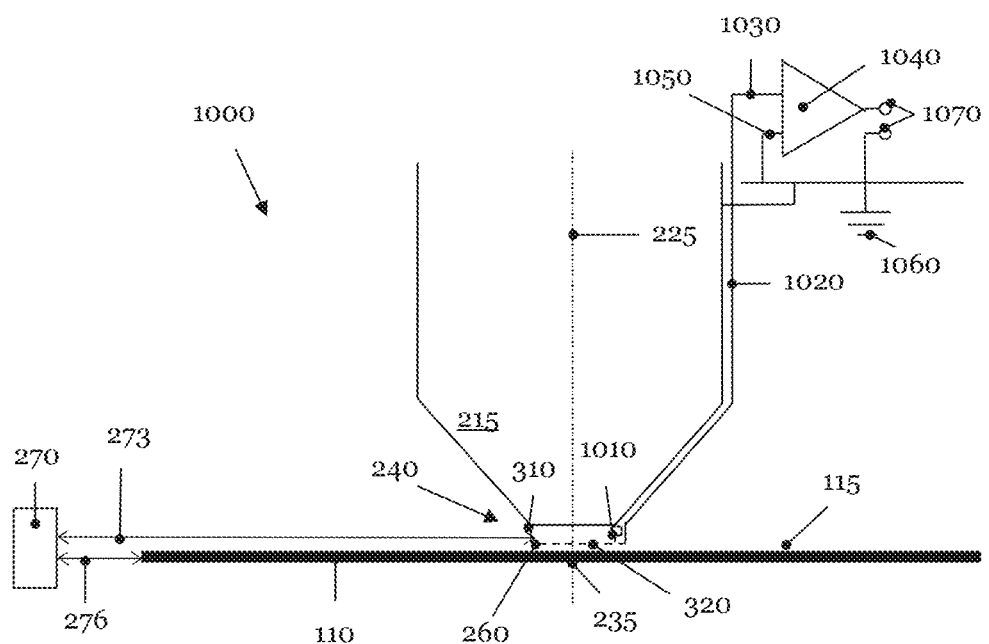
FIG. 10 reproduces a modification of the first exemplary embodiment of the first reference object.

FIG. 10 presents a modification of the first exemplary embodiment of the first reference object 240. The assumption is made below that the grid 410 of the first reference object 240 comprises a conductive material. By way of example, the first reference object 240 may comprise a metal or a metal alloy. At the same time, an electrically conductive first reference object 240 can act as a shielding grid that shields the electric charges 120, 125 that are generated when scanning the contour 440 on the surface 118 of the sample 110 or that are already present on the sample 110. Hence, a conductive first reference object 240 can prevent a deflection of a charged particle beam 225 as a consequence of electric charges 120, 125 present on the sample 110. In addition to the particle beam 225 incident on the sample 110, the charged secondary particles generated by the particle beam 225, which charged secondary particles are used to generate an image of the element 130, 540, 980 of the sample 110, are deflected on their way from the sample surface 115 to the detector 245 by electric charging 120, 125 of the surface 115 of the sample 110. Consequently, an electrically conductive first reference object 240 is simultaneously able to counteract the falsification of the measurement results when examining the element 130, 540, 940.

Further, an electrically conductive first reference object 240 with a grid-like structure 320, such as the grid 410 of FIG. 4, can be connected at one side of the electrically conductive holder 310 to the outlet opening of the particle beam 225 of the column 215. The reflection unit 260 is attached to the left-hand side of the electrically conductive first reference object 230. A second side of the conductive holder 310 is securely connected to the outlet opening of the particle beam 225 by the electric insulator 1010. FIG. 10 shows a schematic section through this arrangement. The electrically insulated side of the grid-like structure 320 or of the grid 410 is connected to an input 1030 of an electrical amplifier 1040 via an electric connection 1020. In the example specified in FIG. 10, the electrical amplifier 1040 is a transimpedance amplifier. However, other amplifier types may also be used.

The second input 1050 of the transimpedance amplifier 1040 is connected to earth 1060. The column 215 of the scanning particle microscope 210 is likewise connected to earth 1060. A voltage can be tapped at the output 1070 of the transimpedance amplifier 1040, said voltage being proportional to the current generated when the particle beam 215 exposes a grid rod of the grid-like structure 320 and releases electric charge at this point. The signal present at the output 1070 of the transimpedance amplifier 1040 consequently indicates whether the particle beam 210 is currently scanning over the surface 115 of the sample 110 or currently striking one of the grid rods of the grid-like structure 320. Hence, the output signal 1070 of the transimpedance amplifier 1040 forms an additional channel to discriminate whether a structure in an image generated by the evaluation unit 286 originates from the element 130, 450, 940 of the sample 110 or from a grid rod of the grid 410.

Figure 11:
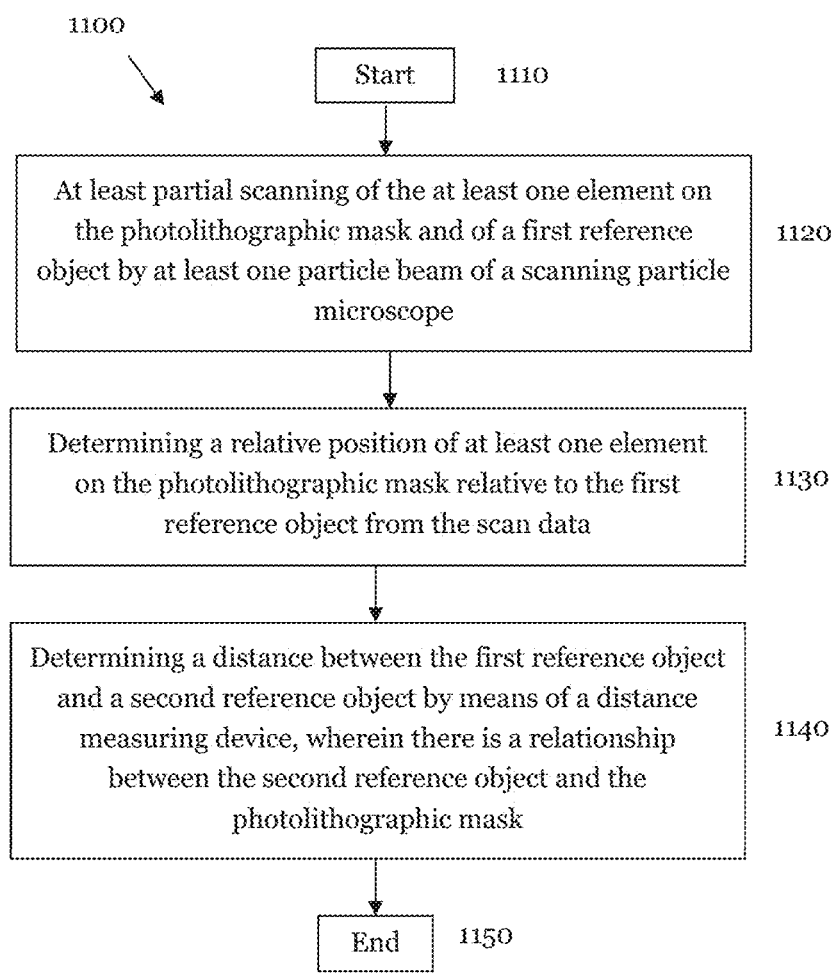
FIG. 11 specifies a flowchart of the method for determining a position of an element on a photolithographic mask.

Finally, the flowchart 1100 of FIG. 11 summarizes once again the steps of the described method for determining a position of at least one element 130, 540, 940 on the photolithographic mask 110. The method begins in step 1110. In the next step 1120, a scan unit 182 of a computer system 280 of the apparatus 200 scans at least one particle beam 225 of the scanning particle microscope 210 over at least a part of the element 130, 540, 940 and a first reference object 240. From the scan data, an evaluation unit 286 of the computer system 280 determines a relative position of the at least one element 130, 540, 940 on the photolithographic mask 110 relative to the first reference object 240. In the next step 1140, the evaluation unit 286 determines a distance between the first reference object 240 and a second reference object 250, wherein there is a relationship between the second reference object 250 and the photolithographic mask 110. The method ends in step 1150. For example, the second reference object 250 can be directly related to the photolithographic mask 110, or can be indirectly related to the sample stage 230, in which a distance between the second reference object 250 and the photolithographic mask 110 is known or previously measured. For example, the second reference object 250 can be part of the photolithographic mask 110 (e.g., a side face of the photolithographic mask 110), or the second reference object 250 can be part of the sample stage 230 so that the position of the second reference object 250 with respect to the photolithographic mask 110 is known. Examples of such a relationship are illustrated in FIGS. 3 and 10.

In some implementations, the computer system 280 can include one or more data processors for processing data, one or more storage devices for storing data, such as one or more databases, and/or one or more computer programs including instructions that when executed by the computer system causes the computer system to carry out the computations or processes described above. The computer system can include one or more input devices, such as a keyboard, a mouse, a touchpad, and/or a voice command input module, and one or more output devices, such as a display, and/or an audio speaker. The computer system can show graphical user interfaces on the display to assist the user of the error correction apparatus.

In some implementations, the computer system 280 can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output.

Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer system 280 is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for determining a position of at least one element on a photolithographic mask described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment.

Conversely, various features that are described in the context of a single embodiment can also be implemented in multiple embodiments separately or in any suitable subcombination. The separation of various system components in the embodiments described above should not be understood as requiring such separation in all embodiments. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. An apparatus for determining a position of at least one element on a sample, the apparatus comprising:
    a. at least one scanning particle microscope comprising a first reference object, wherein the first reference object is disposed on the scanning particle microscope while the scanning particle microscope determines a relative position of the at least one element on the sample relative to the first reference object; and
    b. at least one distance measuring device, which is embodied to determine a distance between the first reference object and a second reference object, the second reference object being different from the first reference object wherein there is a relationship between the second reference object and the sample, and wherein the relationship comprises a known distance between the second reference object and the sample.

2. The apparatus of claim 1, wherein the first reference object is attached to an output of the scanning particle microscope for at least one particle beam and configured to enable the first reference object to be imaged, at least in part, by the at least one particle beam.

3. The apparatus of claim 1, wherein the first reference object comprises at least three marks which span a coordinate system.

4. The apparatus of claim 3, wherein the at least three marks have lateral dimensions ranging from 1 nm to 5000 nm and/or wherein the at least three marks have a height ranging from 1 nm to 1000 nm.

5. The apparatus of claim 3, wherein the at least three marks have a material composition that differs from the material composition of other portions of the first reference object.

6. The apparatus of claim 1, wherein the first reference object is disposed within a depth of field of at least one particle beam of the scanning particle microscope.

7. The apparatus of claim 1, wherein the first reference object comprises a first number of unit cells, wherein each unit cell comprises at least three marks, wherein a second number of particle beams pass through the first number of unit cells, wherein the following applies to the second number: 1≤second number≤first number, and wherein the following applies to the first number: first number>10.

8. The apparatus of claim 1, wherein the first reference object comprises a film, on which at least three marks which span a coordinate system are disposed.

9. The apparatus of claim 1, wherein the first reference object has at least one aperture configured to enable at least one particle beam to pass and sense the sample.

10. The apparatus of claim 9, wherein a scanning unit of the scanning particle microscope is embodied to scan the at least one particle beam over at least one part of the first reference object and over the element of the sample in a common scanning process.

11. The apparatus of claim 1, wherein the first reference object is electrically conductive and configured to enable compensation of surface charges of the sample.

12. The apparatus of claim 1, wherein the scanning particle microscope comprises an evaluation unit that is embodied to determine, from a change in the first reference object, a distortion of an image recorded by the at least one particle beam of the particle beam microscope and/or wherein the evaluation unit is further embodied to determine, on the basis of a model, an electrostatic charge of the sample from a change in the first reference object.

13. The apparatus of claim 1, wherein the at least one distance measuring device comprises at least one interferometer.

14. The apparatus of claim 1, wherein the first reference object is embodied to reflect a light beam of the distance measuring device.

15. The apparatus of claim 1, wherein the second reference object comprises at least one element from the following group: the sample, a sample holder, a reflection apparatus which is attached to the sample and configured to reflect a light beam of the distance measuring device, and a reflection apparatus which is attached to a sample holder and configured to reflect a light beam of the distance measuring device.

16. The apparatus of claim 3, wherein the at least three marks have lateral dimensions ranging from 10 nm to 50 nm, and/or wherein the at least three marks have a height ranging from 10 nm to 200 nm.

17. A method for determining a position of at least one element on a sample, the method including the steps of:
  a. at least partial scanning of the at least one element on the sample and of a first reference object by at least one particle beam of a scanning particle microscope in a common scanning process in which the first reference object is disposed on the scanning particle microscope;
  b. determining a relative position of the at least one element on the sample relative to the first reference object from the scan data; and
  c. determining a distance between the first reference object and a second reference object by use of a distance measuring device, the second reference object being different from the first reference object, wherein there is a relationship between the second reference object and the sample, and wherein the relationship comprises a known distance between the second reference object and the sample.

18. The method of claim 17, further including the step of: determining the position of the at least one element on the sample from the distance between the first and second reference objects and the relative position determined in step b.

19. The method of claim 17, wherein determining the relative position in step b. comprises: determining a change in position of the at least one particle beam relative to the sample during the at least partial scanning of the at least one element on the sample.

20. A computer program containing instructions which prompt a computer system of an apparatus for determining a position of at least one element on a sample to carry out method steps for determining the position of the at least one element on the sample,
  wherein the apparatus comprises:
    at least one scanning particle microscope comprising a first reference object, wherein the first reference object is disposed on the scanning particle microscope while the scanning particle microscope determines a relative position of the at least one element on the sample relative to the first reference object; and
    at least one distance measuring device, which is embodied to determine a distance between the first reference object and a second reference object, the second reference object being different from the first reference object, wherein there is a relationship between the second reference object and the sample, and wherein the relationship comprises a known distance between the second reference object and the sample; and
  wherein the method steps comprise:
    at least partial scanning of the at least one element on the sample and of the first reference object by at least one particle beam of the scanning particle microscope in a common scanning process, in which the first reference object is disposed on the scanning particle microscope;
    determining the relative position of the at least one element on the sample relative to the first reference object from the scan data; and
    determining the distance between the first reference object and the second reference object by use of the distance measuring device.

* * * * *

UNITED STATES PATENT AND TRADEMARK OFFICE
CERTIFICATE OF CORRECTION

| | |
|---|---|
| PATENT NO. | : 11,650,495 B2 |
| APPLICATION NO. | : 17/847641 |
| DATED | : May 16, 2023 |
| INVENTOR(S) | : Michael Budach and Nicole Auth |

It is certified that error appears in the above-identified patent and that said Letters Patent is hereby corrected as shown below:

In the Claims

Column 26
Line 22, in Claim 1, delete "object wherein" and insert -- object, wherein --

Signed and Sealed this
Thirty-first Day of October, 2023

*Katherine Kelly Vidal*

Katherine Kelly Vidal
*Director of the United States Patent and Trademark Office*